United States Patent
Tashiro et al.

[11] Patent Number: 5,904,287
[45] Date of Patent: May 18, 1999

[54] METHOD OF BONDING GRAPHITE TO METAL

[75] Inventors: Minoru Tashiro; Akihiko Kasahara, both of Tokyo, Japan

[73] Assignee: NEC Corporation, Tokyo, Japan

[21] Appl. No.: 08/281,981

[22] Filed: Jul. 29, 1994

[30] Foreign Application Priority Data

Aug. 13, 1993 [JP] Japan ................................ 5-201338

[51] Int. Cl.⁶ ..................................................... B23K 1/20
[52] U.S. Cl. ..................................... 228/124.1; 228/124.5
[58] Field of Search .............................. 228/121, 122.1, 228/124.1, 124.5

[56] References Cited

U.S. PATENT DOCUMENTS

| | | | |
|---|---|---|---|
| 4,000,026 | 12/1976 | Rexter | 228/121 X |
| 4,858,817 | 8/1989 | Hwang et al. | 228/121 |
| 4,978,051 | 12/1990 | Tiearney et al. | 228/124.5 |

FOREIGN PATENT DOCUMENTS

| | | | |
|---|---|---|---|
| 0115577 | 8/1984 | European Pat. Off. | |
| 2115254 | 7/1972 | France | |
| 2440988 | 3/1975 | Germany | 378/144 |
| 62-21768 | 1/1987 | Japan | |
| 63-310778 | 12/1988 | Japan | |

OTHER PUBLICATIONS

Chemical Abstract, vol. 113, No. 22, Nov. 26, 1990, Columbus, Ohio, US; Abstract No. 196591n, p. 325, "Brazing of Prolytic Graphite Parts to Metal Parts".

Chemical Abstracts, vol. 113, No. 2, Jul. 9, 1990, Columbus, Ohio, US; abstract No. 11004g, p. 228, "Bonding of Ceramic Parts to Ceramic or Metal Parts".

*Primary Examiner*—Kenneth J. Ramsey
*Attorney, Agent, or Firm*—Sughrue, Mion, Zinn, Macpeak & Seas

[57] ABSTRACT

The method for bonding graphite to metal, includes the steps of forming a metal carbide layer on a surface of the graphite, the metal being to be bonded to said graphite, and brazing the graphite to the metal with an active alloy brazing material. The present invention is based on the fact discovered by the inventor that if a metal carbide layer is in advance formed on a surface of a graphite, an active metal such as Ti could more easily react on the metal carbide layer to thereby bond the metal to the graphite, rather than the case in which a graphite member is made to directly react on an active metal to thereby bond the graphite member to the metal.

5 Claims, 1 Drawing Sheet

METHOD OF BONDING GRAPHITE TO METAL

BACKGROUND OF THE INVENTION

1. Field of the Invention

The invention relates to a method for bonding graphite to metal, and more particularly to such a method using an active alloy brazing process.

2. Description of the Related Art

Graphite has various superior properties, for instance, high thermal conductivity, low thermal expansion coefficient, low secondary electron emission coefficient and high emissivity. Thus, it has been researched so far to apply the graphite, for instance, to walls of a plasma container for a nuclear fusion reactor, a collector electrode of an electron tube, and capillaries of an ion laser tube. In these applications, a member made of graphite is supported by or secured to other members made of material other than graphite, in almost all cases, metal, by any means. When high mechanical strength and high thermal conductivity are required for such support and securing, a brazing process is usually chosen.

As is understood from the fact that the graphite is suitable for walls of a metal fusion furnace and a crucible, the graphite has an inherent property of not reacting with molten metal. However, the graphite reacts on an active metal such as Ti, Zr, Ta and Mo at a temperature over 1,000 degrees centigrade, and thus forms a layer composed of a carbide of these metals at an interface thereof, to thereby firmly bond with the metal.

For instance, Japanese Unexamined Patent Public Disclosure No. 62-21768 published on Jan. 30, 1987 teaches that graphite can be bonded to Mo or Ni—Cr—Fe alloy, including Mo by more than 8%, in an inert gas atmosphere, for instance, under heat treatment at a temperature of 1,400 degrees centigrade for 90 hours.

Japanese Unexamined Patent Public Disclosure No. 63-310778 published on Dec. 19, 1988 discloses a process in which a surface of a member composed of graphite is first metalized with an active brazing alloy having Ti—Cu—Ag structure, and then brazed with a brazing alloy such as Ag, Au and Ni, to thereby form a stress relaxation layer for bonding the graphite to metal.

In the aforementioned brazing processes in which an active alloy brazing material is to be used, since the active alloy reacts on and thereby bonds to the graphite only within the area of contact between the active alloy and the graphite surface sufficient pressure, for instance, in the range of 200 grams per square centimeter or more and also a temperature of approximately 1,000 degrees centigrade it is necessary for bonding to apply to the contact area. In addition, since the reaction develops at relatively slow speed under the high temperature, it takes a relatively long time for brazing. This increases probability of coarsening of crystal grains and/or deformation due to creep in metal parts or jigs. Accordingly, it was required to fabricate the metal parts or jigs tougher for preventing such crystal grain coarsening and deformation.

As above mentioned, in a process utilizing solid phase reaction by active metal, the reaction develops first at a contact surface of the graphite and the active metal, and then the bonding area enlarges due to thermal deformation and diffusion. Accordingly, it is necessary to apply a pressure over approximately 100 grams per square centimeter and also high temperature to the area along which the graphite is to be bonded to the metal, and further it is necessary to continue such brazing operation for a long time. For instance, the aforementioned Japanese Unexamined Patent Public Disclosure No. 62-21768 teaches that it needs a high temperature and a long time are required, specifically the temperature of 1,400 degrees centigrade for 90 hours, for bonding the graphite with the metal.

Such temperature is equal to or higher than a melting point, or higher than two thirds of the melting point of an ordinary industrial metalic material such as oxygen free copper, copper-nickel alloy, stainless steel and iron-nickel alloys. In addition, since the metalic materials are heated for long hours, melting of the metal, recrystallization of metal crystals and coarsening of crystal grains are remarkable, thereby remarkably decreasing the mechanical strength of the resultants.

In the case that the above mentioned process is to be applied to parts for use of an electron tube, there arise problems that metal parts are deformed due to high temperature creep; and that brazing materials in particular silver and gold develop into an alloy to thereby cause erosion of the brazing materials. This results in inaccurate dimensions and higher probability of occurrence of inferior sealing.

In the process disclosed in the above mentioned Japanese Unexamined Patent Public Disclosure No. 63-310778, in which a surface of a graphite member is in advance metalized with Ti—Cu—Ag brazing material, it takes relatively short time for brazing since the surface is metalized. However, in the case where brazing materials are to be used for areas to be exposed to electron beams or high temperature gas plasma, such as a collector of an electron tube and a gas laser tube, the metalized surface deteriorates inversely to the amount of the secondary electron emission and plasma-resisting property to a degree worse than the graphite.

SUMMARY OF THE INVENTION

It is an object of the present invention to provide a method for bonding graphite to metal without degradation of the mechanical properties, inaccuracy of dimensions and inferior sealing and also without degradation of secondary electron emission and plasma-resisting property.

The invention provides a method for bonding graphite to metal, including the steps of forming a metal carbide layer on a surface of the graphite, the metal being to be bonded to the graphite, and brazing the graphite to the metal with an active alloy brazing material.

In a preferred embodiment, the metal carbide layer is composed of any one of metal carbides selected from the group consisting of TiC, TaC, ZrC and NbC.

In another preferred embodiment, the metal carbide layer has thickness in the range of 25 micrometers through 300 micrometers.

In still another preferred embodiment, the metal carbide layer is formed by chemical vapor reaction (CVR) process.

In yet another preferred embodiment, the active brazing alloy includes Ti.

In still yet another preferred embodiment, the graphite has thermal expansion coefficient which is different from that of the metal carbide layer by $1 \times 10^{-6}$ per degree or less.

The inventor has conducted many experiments and analysis to solve the above mentioned problem, and then has found the fact that if a metal carbide layer is in advance formed on a surface of a graphite member, an active metal such as Ti could more easily react on the metal carbide layer to thereby bond the metal to the graphite, rather than the case in which a graphite member is made to directly react on an active metal such as Ti to thereby bond the graphite member to the metal.

In other words, the present invention is based on the fact that the wettability or reactivity between an active metal such as Ti and metal carbide is greater by one order or more than the wettability or reactivity between an active metal and graphite. For instance, if a member composed of graphite is covered at its surface with TaC and NbC layers having thicknesses of 50 micrometers each, Ti—Cu or Ti—Au active alloy brazing material can flow out to and spread in the surface by capillary phenomenon when one through two minutes has passed after the brazing material had melted, similarly to the case in which metal such as Cu and Mo are to be brazed to graphite. Thus, the graphite is bonded to the metal.

Thus, the present invention provides a new method for reforming a surface layer of a graphite member, in which method a carbide layer is in advance formed on a surface of a graphite member. As explained later in detail, the method in accordance with the invention has many advantages. More specifically, the method can provide a graphite-metal bonding structure having high mechanical strength, high heat-conductivity, high radiation rate and low secondary electron emission coefficient all of which cannot be obtained by a conventional metal surface layer or metalized layer.

The method for bonding graphite to metal in accordance with the invention can be applied to a collector or an anode of an electronic tube which receives electron bombardment, capillary or parts disposed between gas lasers and exposed to high plasma of more than 2,000 degrees centigrade, and inner walls of a nuclear fusion reactor.

The advantages obtained by the aforementioned present invention will be described hereinbelow.

In the present invention, a metal carbide layer is first formed on a surface of a graphite member. This much increases the wettability or reactivity and flowability of a brazing material relative to a conventional direct brazing. Thus, it is possible to braze by preplaced brazing similar to the brazing of metal to other metal. Accordingly, the brazing material is not limited to the shape of a board, and hence it is possible to use brazing materials having the shape of a wire or a, rod or in the form of, powder and paste.

Accordingly, it is easier to design parts for brazing, and in addition, it is no longer necessary to apply the pressure of approximately 300 grams per square centimeter or more to a surface along which graphite is bonded to metal. Hence, it can advantageously simplify jigs and parts for brazing.

Furthermore, since a time period for brazing is in the order of several minute, no consideration needs to be taken for thermal loss and mechanical degradation of jigs and parts for brazing. This makes it possible to shorten the time period for brazing, and hence enhances the operation rate of vacuum brazed equipment and further lengthens the lifetime of the equipment.

The metal carbide layer formed in advance on a surface of a graphite member has various advantages. For instance, if the present invention is applied to an electron tube for microwaves or parts for a gas laser tube, it is possible to prevent the occurrence of inferior sealing due to dust and to depress secondary electron emission, and further to enhance plasma-resisting property.

As is clear to those skilled in the art, it is obvious that the present invention can use any method for forming a metal carbide layer on a surface of a graphite member. For instance, a chemical vapor deposition (CVD) process and a physical vapor deposition (PVD) process such as sputtering and ion plating are suitable for that purpose.

The above and other objects and advantageous features of the present invention will be made apparent from the following description made with reference to the accompanying drawings, in which like reference characters designate the same of similar parts throughout the drawings.

BRIEF DESCRIPTION OF THE DRAWINGS

This file contains at least one color drawing.

DESCRIPTION OF THE PREFERRED EMBODIMENT

A preferred embodiment in accordance with the invention will be explained hereinbelow with reference to drawings.

Figure 1:
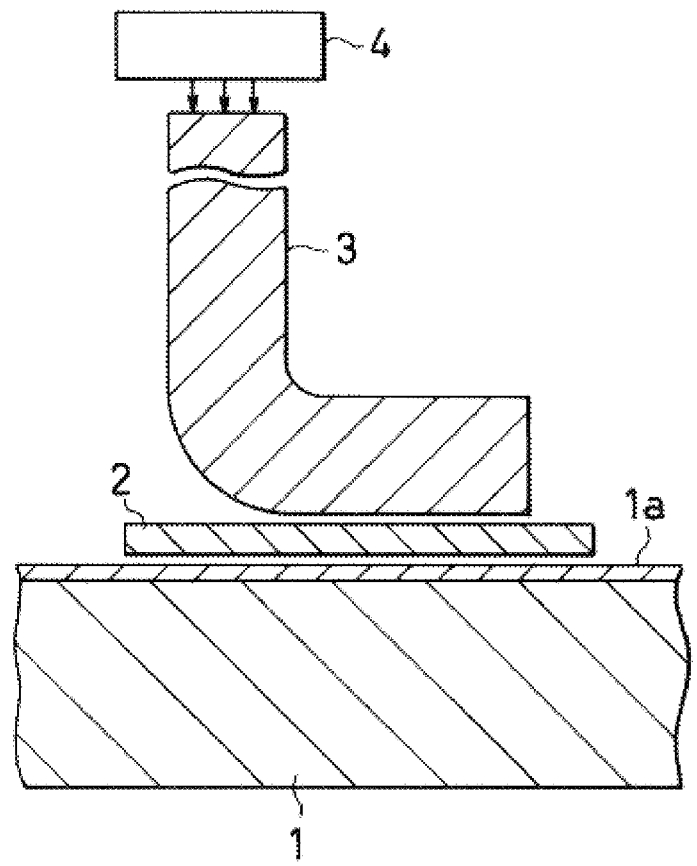
FIG. 1 is a cross-sectional view for explaining an embodiment in accordance with the invention in which a graphite member is to be bonded to a metal member.
Figure 2:
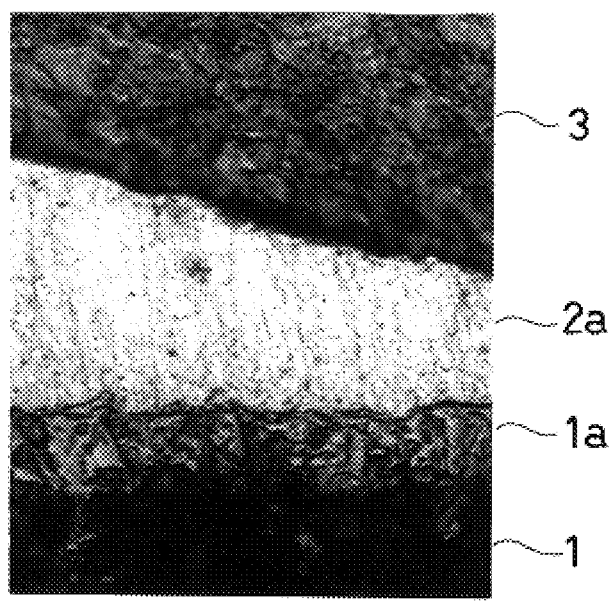
FIG. 2 is a color microphotograph showing a structure of an area in which the graphite member is bonded to the metal member.

FIG. 1 is a cross-sectional view of an area in which a graphite member 1 is to be bonded to a metal member 3 constituted of Mo. FIG. 2 is a picture showing a structure of the bonding area and taken by an optical microscope. As illustrated in FIG. 1, at first, the graphite member 1 is covered at a surface thereof with a layer 1a constituted of TiC and having thickness of 50 micrometers by means of a chemical vapor reaction (CVR) process. Then, overlaid on the TiC layer 1a is a brazing plate 2 constituted of Ti by 3% and Au by 97% and having thickness of 0.1 millimeter, and further overlaid on the brazing plate 2 is a metal plate 3 composed of Mo and having thickness of 0.3 millimeters. Then, placed on the metal plate 3 is a weight 4 of approximately 150 grams, and subsequently, the entire resultant is placed in a vacuum brazing furnace and then is brazed. The brazing was conducted while maintaining the degree of vacuum in the vacuum brazing furnace at not more than $2 \times 10^{-4}$ Pa. The temperature in the furnace was heated up to approximately 950 degrees centigrade within approximately one hour and a half. Observing the inside of the furnace through an observation window, the heating was stopped after it was confirmed that the brazing plate 2 started to melt and flow out. It was observed that the brazing plate 2 started to melt at the temperature of 1,030 degrees centigrade, and it took about 3 minutes for the brazing plate 2 to wholly melt and flow into between the metal plate 3 and the graphite part 1. This period of time was almost the same as that necessary for brazing metal to other metal, for instance, brazing Mo to oxygen free copper.

Then, the bonded structure was cooled down to 300 degrees centigrade within about 40 minutes, and subsequently further cooled down to the room temperature by introduction of nitrogen gas. The brazing plate 2 was perfectly melted. As is understood from FIG. 2, a 2 00 times magnified picture taken with an optical microscope and showing the bonding structure, the wholly melted brazing plate 2 becomes a brazing material layer 2a and forms a wet or reactive fillet together with the metal part 3 and the graphite 1. Thus, it can be observed that the brazing material layer 2a is bonded at its entire top surface to the metal part 3 and is also bonded at its bottom surface to the TiC layer 1a and hence the graphite 1.

Hereinbelow will be explained an analysis with respect to wettability or reactivity of a brazing material disposed on a metal carbide layer. As explained above, the inventor has found the fact that the wettability or reactivity between a metal carbide layer and an active metal brazing material is much better than that between a graphite and an active metal brazing material, and thus it is industrially preferable to add a step of forming a metal carbide layer. In accordance with this discovery, the inventor conducted an experiment with respect to other metal carbides which can be formed on a graphite. The results are shown in Table 1.

TABLE 1

| Sample No. | Metal Carbide | Thickness ($\mu$m) | Brazing Material | Brazing Temp. (° C.) | Contact Angle (degree) |
|---|---|---|---|---|---|
| 1 | TiC | 100 | 3% Ti—Cu | 1055 | 12–34 |
| 2 | TaC | 50 | 3% Ti—Cu | 1055 | 10–40 |
| 3 | TaC | 85 | 2.3% Ti—Cu | 1060 | 7–38 |
| 4 | ZrC | 50 | 2.3% Ti—Au | 1060 | 10–30 |
| 5 | ZrC | 70 | 3% Ti—Cu | 1055 | 9–35 |
| 6 | NbC | 50 | Ti—Cu—Ag | 830 | 5–30 |
| 7 | No layer (for reference) | | 2.3% Ti—Au | 1060 | 55–120 |
| 8 | No layer (for reference) | | 3% Ti—Cu | 1055 | 50–135 |

It has been found based on the experimental results shown in Table 1 that the brazing materials including Ti has the superior wettability or reactivity to various metal carbides. It should be noted that the thickness of a metal carbide layer highly influences the adhesion between a metal carbide layer and a graphite member disposed below the carbide layer. In particular, a smaller difference in thermal expansion coefficient between the graphite and the metal carbide layer causes less possibility of peeling and cracking. Accordingly, if the difference is sufficiently small, the metal carbide layer can have thicker thickness. According to the experiments conducted by the inventor, the difference in thermal expansion coefficient between the graphite and the metal carbide layer is preferable $1.5 \times 10^{-6}$ per degree or less, and more preferable $1 \times 10^{-6}$ per degree or less.

The thickness of the metal carbide layer has to be determined taking into consideration a structure of a brazed equipment and conditions for use thereof. If the thickness is equal to or less than 25 micrometers, the metal carbide layer may not entirely cover irregularities of a surface of the graphite 1, and if the thickness is over 300 micrometers, the adhesion between the graphite and the metal carbide layer is deteriorated. Thus, it is preferable to arrange the thickness of the carbide layer in the range of 25 to 300 micrometers.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method for bonding graphite to metal, comprising the steps of:

forming a metal carbide layer having a thickness of at least 25 micrometers on a surface of said graphite, said metal carbide layer being composed of any one of metal carbides selected from the croup consisting of Tic TaC, ZrC and NbC; and brazing said metal carbide layer to said metal with an active alloy brazing material to bond said graphite to said metal.

2. A method in accordance with claim 1, wherein said metal carbide layer has thickness in the range of 25 micrometers through 300 micrometers.

3. A method in accordance with claim 1, wherein said metal carbide layer is formed by chemical vapor reaction (CVR) process.

4. A method in accordance with claim 1, wherein said active alloy brazing material includes Ti.

5. A method in accordance with claim 1, wherein said graphite has thermal expansion coefficient which is different from that of said metal carbide layer by $1 \times 10^{-6}$ per degree or less.

* * * * *